(12) United States Patent
Smith

(10) Patent No.: US 11,556,248 B2
(45) Date of Patent: Jan. 17, 2023

(54) APPARATUSES AND METHODS FOR DIFFERENT BURST LENGTHS FOR STACKED DIE

(71) Applicant: MICRON TECHNOLOGY, INC., Boise, ID (US)

(72) Inventor: Scott Eugene Smith, Plano, TX (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 17/210,905

(22) Filed: Mar. 24, 2021

(65) Prior Publication Data
US 2021/0311627 A1  Oct. 7, 2021

Related U.S. Application Data

(60) Provisional application No. 63/006,195, filed on Apr. 7, 2020.

(51) Int. Cl.
*G06F 3/06* (2006.01)

(52) U.S. Cl.
CPC ............ *G06F 3/061* (2013.01); *G06F 3/0655* (2013.01); *G06F 3/0679* (2013.01)

(58) Field of Classification Search
CPC ....... G06F 3/061; G06F 3/0655; G06F 3/0679
See application file for complete search history.

(56) References Cited

U.S. PATENT DOCUMENTS

| | | | | |
|---|---|---|---|---|
| 2013/0336039 A1* | 12/2013 | Frans | ..................... | G11C 5/063 365/51 |
| 2014/0104935 A1* | 4/2014 | Ware | .................. | G06F 13/1673 365/233.13 |
| 2015/0234746 A1 | 8/2015 | Jo | | |
| 2016/0086642 A1 | 3/2016 | Frans | | |
| 2018/0137909 A1 | 5/2018 | Shaeffer et al. | | |
| 2019/0005991 A1* | 1/2019 | Kim | ..................... | G11C 11/412 |
| 2019/0273065 A1 | 9/2019 | Yu et al. | | |
| 2019/0310798 A1* | 10/2019 | Yoon | ....................... | G06F 3/061 |
| 2019/0332561 A1* | 10/2019 | Schreiber | .............. | G06F 13/385 |
| 2021/0004178 A1* | 1/2021 | Shi | ...................... | G06F 13/1668 |

FOREIGN PATENT DOCUMENTS

WO      2014084855 A1    6/2014

OTHER PUBLICATIONS

ISR/WO dated Jul. 19, 2021 for PCT Appl. No. PCT/US2021/024686 (P284159.WO.01).
PCT Patent Application PCT/US21/24686 titled "Apparatuses and Methods for Different Burst Lengths for Stacked Die" filed Mar. 29, 2021.

* cited by examiner

*Primary Examiner* — Nanci N Wong
(74) *Attorney, Agent, or Firm* — Dorsey & Whitney LLP

(57) ABSTRACT

In some examples, a master die may receive data from one or more slave die. The master die may provide data from the master die and the data from the one or more slave die to a plurality of output terminals. Data from the master die may be provided for a portion of a data burst and data from the slave die may be provided for another portion of the data burst. In some examples, a master die may provide data to one or more slave die. The master die may provide data to the master die and the data to the one or more slave die from a plurality of input terminals. Data from the input terminals may be provided to the slave die for a portion of a data burst and data may be provided from the master die for another portion of the data burst.

20 Claims, 10 Drawing Sheets

APPARATUSES AND METHODS FOR DIFFERENT BURST LENGTHS FOR STACKED DIE

CROSS REFERENCE TO RELATED APPLICATION(S)

This application claims priority to U.S. Provisional Application No. 63/006,195, filed Apr. 7, 2020. The aforementioned application is incorporated herein by reference, in its entirety, for any purpose.

BACKGROUND

In recent years, three-dimensional (3D) memory devices have been introduced. Some 3D memory devices are formed by stacking die vertically and coupling the die using through-silicon (or through-substrate) vias (TSVs) and/or wire bonds. Thus, 3D memory may also be referred to as "stacked memory." 3D memory may provide greater memory capacity and/or higher bandwidth with less increase in area than non-3D memory. Example 3D memory devices include Hybrid Memory Cube (HMC), High Bandwidth Memory (HBM), and Master-Slave Memory (MSM).

MSM may include multiple dynamic random access memory (DRAM) die coupled to one another in a stack. One die may serve as a master die and the remaining die may serve as slave die. The master die may control memory operations of the slave die. In some MSM, the master die and slave die may be identical with either a hardwired or programmable designation as to which die serves as the master die. In other MSM, the master die may have a different design than the slave die. The master die may be the only die of the MSM to directly interface with a component external to the memory (e.g., a substrate, a memory controller). Having only one die directly coupled to a component external to the MSM in a device including the MSM (e.g., a memory module including multiple MSMs, a computing device) may reduce loading on the device. However, this advantage may require that all data from the slave die is transmitted through the master die, which may limit bandwidth and/or speed of the MSM.

DETAILED DESCRIPTION

The apparatuses and methods disclosed herein may allow for 3D memory/stacked memory, such as master slave memory (MSM) to provide and/or receive longer burst lengths without increasing a number of connectors between the die of the stack in some embodiments. For example, a memory device may include multiple die, one of which may be a master die. The master die may include multiple input and/or output terminals. For some memory access operations, such as read operations, the memory device may retrieve data from the multiple die. Data from the die may be provided to the master die. The master die may provide data from one or more of the multiple die for different portions of a data burst (also referred to as a burst of data). For some memory access operations, such as write operations, the memory device may provide data to the multiple die. Data may be provided to the master die. The master die may provide the data to one or more of the multiple die for different portions of a data burst.

Figure 1:
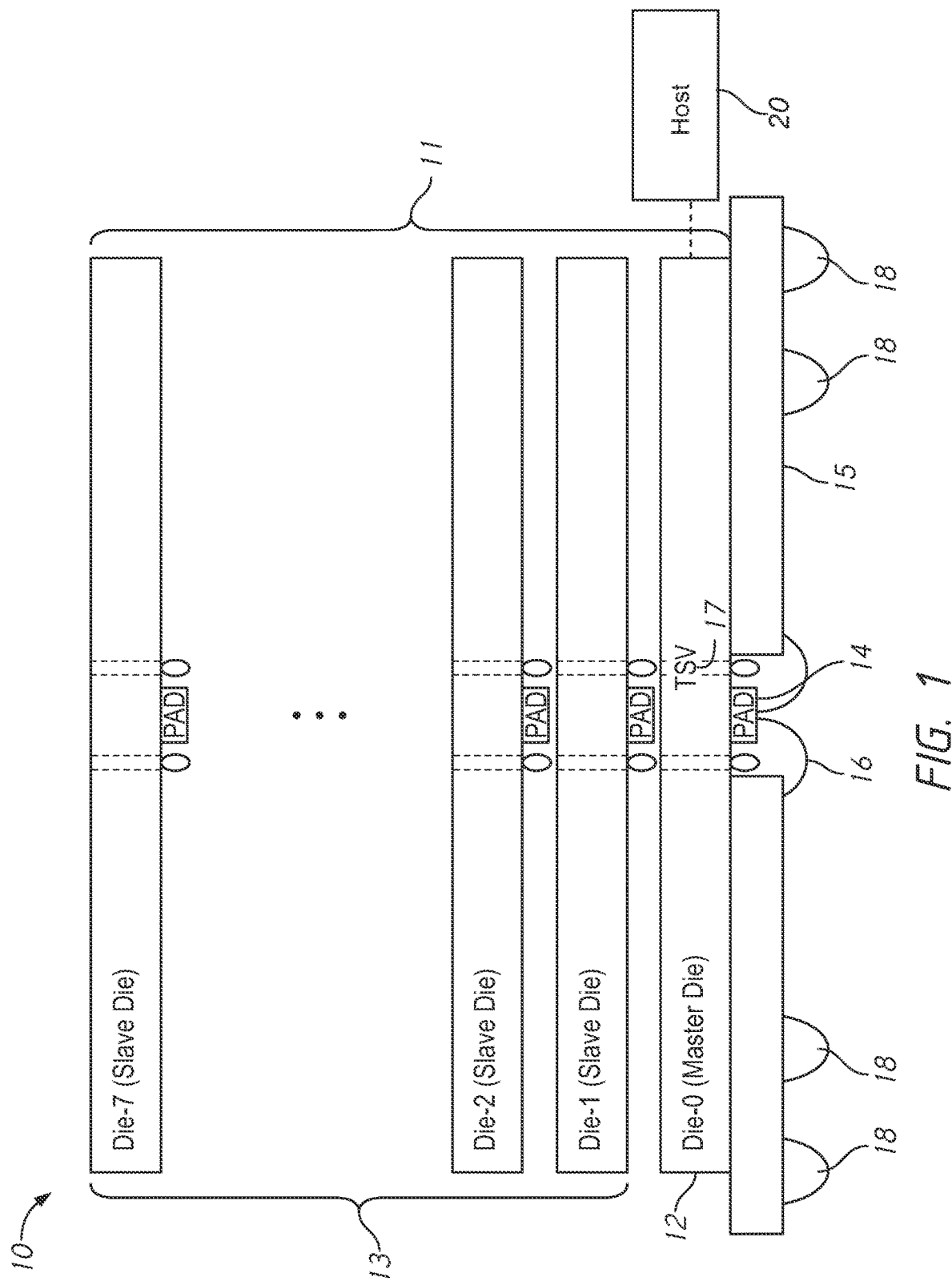
FIG. 1 is a schematic diagram of a memory device including a plurality of dies in accordance with an embodiment of the present disclosure.

FIG. 1 is a schematic diagram of a memory device 10 including multiple die 11 in accordance with an embodiment of the present disclosure. In the embodiment shown in FIG. 1, memory device 10 includes eight die 11, however, memory device 10 may include two or more die. In some embodiments, the die 11 may be arranged in a stack that includes a master die 12 and one or more slave die 13. In some embodiments, the die 11 may be identical to one other with respect to circuit configurations. In some embodiments, master die 12 may be designated as the master die and slave die 13 may be designated as slave die by hardwiring (e.g., fuse blowing) and/or programmed (e.g., writing to a register) on the die 11. The master die (Die-0) 12 may include one or more pads PAD 14 that are coupled to a package substrate 15 via one or more bonding wires 16. The one or more bonding wires 16 may be coupled to lands (e.g., pads) (not shown) of the package substrate 15. Bonding Pads (PAD) of each of the slave die 13 (Die-1 to Die-7) may be in a floating state, decoupled from the package substrate 15. The master die 11 may communicate with each of the slave die 13 (Die-1 to Die-7) by way of vias TSV 17 (e.g., through-substrate or through-silicon vias) and/or wire bonds (not shown). Bump electrodes 18 may be disposed on an outer surface of the package substrate 15. The bump electrodes 18 may be coupled to power lines or signal channels (not shown) of memory device 10 or of a device including memory device 10 (not shown).

The memory device 10 may be a Master-Slave Memory (MSM) in some embodiments. That is, the master die 12 may be the only die of the MSM to directly interface with a component external to the memory (e.g., a substrate, a memory controller). The external component may be included in a host 20 (e.g., computing device, computing system) in some examples. The master die 12 may receive commands, addresses, data, and/or other signals from the host 20 and relay the commands, addresses, data and/or other signals to one or more of the slave die 13 when an operation utilizes one or more of the slave die 13.

Figure 2:
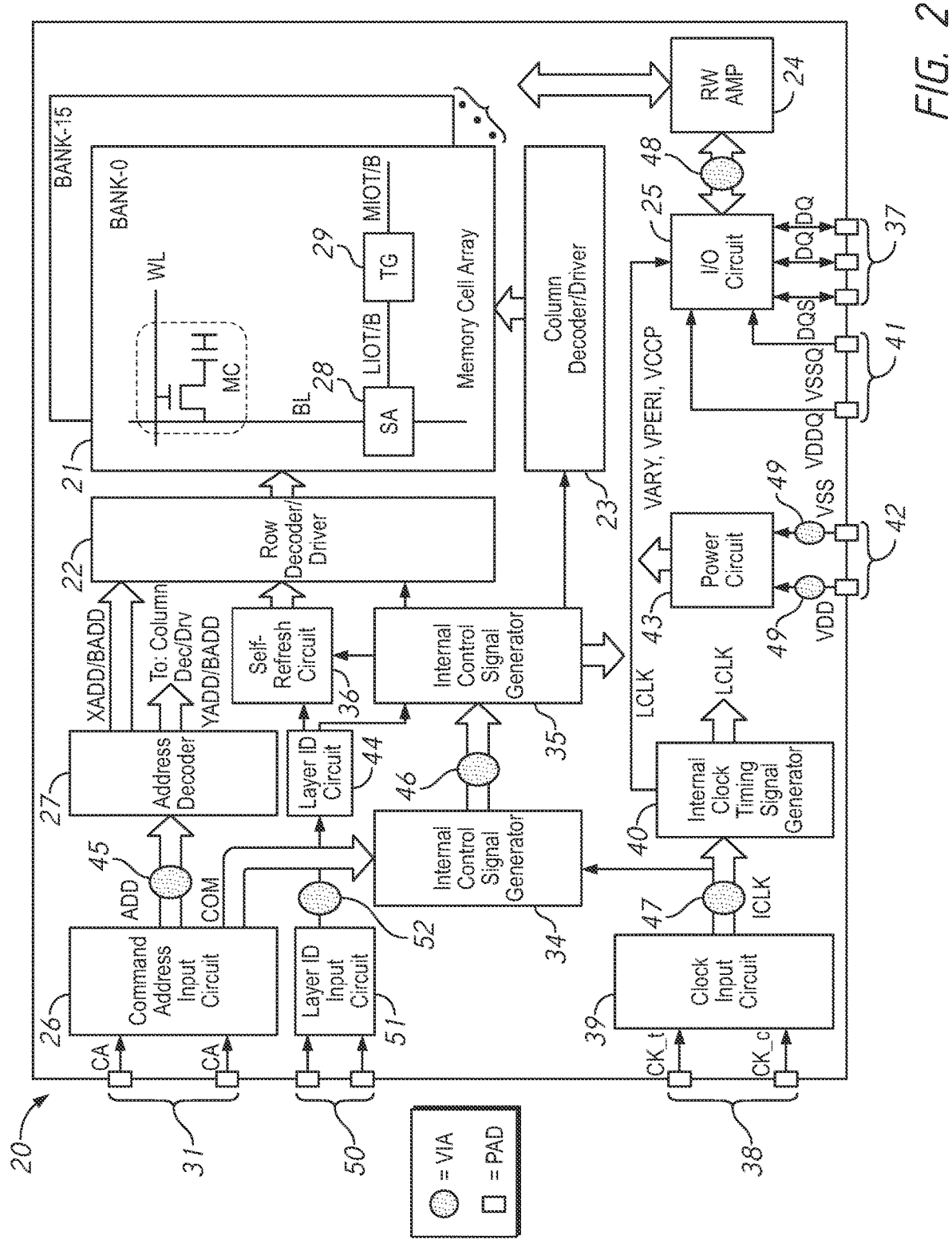
FIG. 2 is a block diagram of a memory die in accordance with an embodiment of the present disclosure.

FIG. 2 is a block diagram of a memory die 20 in accordance with an embodiment of the present disclosure. In some embodiments, the memory die 20 may be used to implement one or more of die 11 shown in FIG. 1. In some embodiments, memory die 20 may be a memory device. For example, the memory die 20 may be a volatile memory device, such as a dynamic random access memory, a static random access memory, or the like. The memory die 20 may be a non-volatile memory device, such as a NOR or NAND flash memory device. The memory die may also be other examples of memory devices, such as, magnetoresistive random access memory, ferroelectric memory, etc. As shown in FIG. 2, the memory die 20 may include a memory cell array 21. The memory cell array 21 includes a plurality of banks (e.g., BANK-0 to BANK-15), each bank including a plurality of memory cells MC arranged at intersections of a plurality of word lines WL and a plurality of bit lines BL. However, for clarity, only a single memory cell MC, word line WL, and bit line BL are shown in FIG. 2. A selection of the word line WL is performed by a row decoder/driver 22 and a selection of the bit line BL is performed by a column decoder/driver 23. Sense amplifiers SA 28 are coupled to corresponding bit lines BL and connected to local I/O line pairs LIOT/B. Local IO line pairs LIOT/B are connected to main IO line pairs MIOT/B via transfer gates TG 29 which are configured as switches.

Turning to the explanation of a plurality of external terminals (or pads) included in the memory die 20, the plurality of external terminals (or pads) may include command/address terminals 31, clock terminals 38, data terminals 37, power supply terminals 41 and 42, and layer ID terminals 50. In some embodiments, the plurality of external terminals may be included in pads 14 in FIG. 1. The command/address terminals 31 may receive command address signals CA and provide the command address signals CA to a command address input circuit 26. The command address input circuit 26 may decode the command address signals CA to generate address signals ADD provided to an address decoder 27 in the master die (e.g., Die-0). The address decoder 27 of each slave die of the slave die (e.g., Die-1 to Die-7) may receive the address signals ADD through address via 45 from the master die (e.g., Die-0). The address decoder 27 may provide decoded row address signals XADD to the row decoder/driver 22, and decoded column address signals YADD to the column decoder/driver 23. The address decoder 27 may also provide bank address signals BADD to the row decoder/driver 22. While the command address terminals 31 and the command address input circuit 26 may be also included in each slave die of the slave die (e.g., Die-1 to Die-7), the address decoder 27 of each slave die of the slave dies (e.g., Die-1 to Die-7) may receive the address signals ADD through address via 45 from the master die (e.g., Die-0). That is, in some embodiments, the command address terminals 31 and/or command address input circuit 26 may be disabled and/or unused on slave die.

In master die (e.g., Die-0), the command address input circuit 26 may provide the command signals COM to a command decoder 34. The command signals COM may include one or more separate signals. The command signals COM received by the command address terminals 31 may be provided to the command decoder 34. The command decoder 34 may decode the command signals COM and provide the decoded command signals to an internal control signal generator 35. The decoded command signals may be provided to an internal control signal generator 35 of each slave die (e.g., Die-1 to Die-7) through command via 46. Thus, in some embodiments, the command decoder 34 of the slave die may be disabled and/or unused. The internal control signal generator 35 may generate various control signals. For example, the control signals may include a row command signal to select a word line and a column command signal, such as a read command or a write command, to select a bit line, and an auto refresh signal that may be provided to a self-refresh circuit 36.

When a row activation command is issued and a row address is timely supplied with the activation command, and a column address is timely supplied with a read command, read data is read from memory cell or cells MC in the memory cell array 21 designated by the row address and column address responsive to a data strobe signal received at a DQS pad of the data terminals 37. The read data DQ is provided as output signals at DQ pads of the data terminals 37 through a read/write amplifier (RW AMP) 24 and an input/output (110) circuit 25 and/or through data via 48 between the read/write amplifier 24 and the input/output circuit 25. Similarly when the row activation command is issued and a row address are timely supplied with the activation command, and a column address is timely supplied with a write command, and then write data DQ is supplied to the DQ pads together with the data strobe signal at the DQS pad of the data terminals 37, the write data DQ is supplied via the input/output circuit 25 and the read/write amplifier 24 to the memory cell array 21 and written in the memory cells MC designated by the row address and the column address.

The data paths between the input/output circuit 25 and the read/write amplifier 24 in a master die (e.g., Die-0) may be coupled through the data via 48 to the data paths between the input/output circuit 25 and the read/write amplifier 24 in each slave die of slave dies (e.g., Die-1 to Die-7). Thus, the input/output circuit 25 of master die (e.g., Die-0) may receive read data from one or more slave die (e.g., Die-1 to Die-7) and write data to be written into one or more slave die (e.g., Die-1 to Die-7). In some embodiments, while the slave die may include I/O circuit 25 and data terminals 37, the I/O circuit 25 and/or one or more of the data terminals 37 may be disabled and/or unused. In some embodiments, the I/O circuit 25 may include switches, logic circuits and/or other control circuitry (not shown) that determines whether data from the master die or data from one or more of the slave die is provided to the DQ pads of the data terminals 37. As will be described in more detail, in some embodiments, the I/O circuit 25 of the master die may provide data from the master die and one or more slave die on the DQ pads of the data terminals 37. For example, data terminals 37 may include DQ pads DQ0-7. The I/O circuit 25 may provide data from the master die on DQ pads for a first half of a data burst and provide data from the slave die on DQ pads for a second half of the data burst.

The clock terminals 38 may receive external clock signals CK_t and CK_c of the master die (e.g., Die-0), respectively. These external clock signals CK_t and CK_c are complementary to each other and are supplied to a clock input circuit 39. The clock input circuit 39 may receive the external clock signals CK_t and CK_c and may generate an internal clock signal ICLK. The clock input circuit 39 may provide the internal clock signal ICLK an internal clock and timing signal generator 40 and thus a phase controlled internal clock signal LCLK may be generated based on the received internal clock signal ICLK. Although not limited thereto, a DLL circuit can be used as the internal clock and timing signal generator 40. The phase controlled internal clock signal LCLK is supplied to the input/output circuit 25 and may be used as a timing signal for determining an output timing of the read data DQ. The internal clock signal ICLK is also supplied to the command decoder 34 for decoding the command signal COM to generate various control signals. The internal clock signal ICLK from the clock input circuit 39 of the master die (e.g., Die-0) may be supplied through clock via 47 to an internal clock and timing signal generator 40 of the slave die (e.g., Die-1 to Die-7) to perform similar operations to the internal clock and timing signal generator 40 of the master die (e.g., Die-0). In some embodiments, the clock input circuit 39 may not be used and/or disabled on the slave die.

The power supply terminals 41 are supplied with power supply potentials VDDQ and VSSQ. These power supply potentials VDDQ and VSSQ are supplied to the input/output circuit 25. The power supply potentials VDDQ and VSSQ may be the same potentials as the power supply potentials VDD and VSS that are supplied to the power supply terminals 42, respectively. However, the dedicated power supply potentials VDDQ and VSSQ may be used for the input/output circuit 25 so that power supply noise generated by the input/output circuit 25 does not propagate to the other circuit blocks.

The power supply terminals 42 are supplied with power supply potentials VDD and VSS. These power supply potentials VDD and VSS are supplied to a power circuit 43. The internal power circuit 43 may generate various internal potentials VARY, VPERI, VCCP and the like based on the power supply potentials VDD and VSS. The internal potential VCCP may be a voltage higher than the power supply potential VDD generated by a charge pumping circuit (not shown) and may be mainly used in the row decoder/driver 22. The internal potential VARY may be mainly used in the sense amplifiers 28 included in the memory cell array 21, and the internal potential VPERI may be used in many other circuit blocks. The power supply potentials VDD and VSS supplied to the power supply terminals 42 of the master die (e.g., Die-0) may be provided to a power circuit 43 of each slave die (e.g., Die-1 to Die-7) through power via 49 in order to generate internal potentials for each slave die.

The memory die 20 may include pads and vias. As mentioned earlier, the pads may include the command and address terminals 31, the data terminals 37, the clock terminals 38, and power terminals 41 and 42. For example, the vias may be through silicon vias and the vias may include the address via 45, the command via 46, the clock via 47, the data via 48, the power via 49, and layer via 52. As mentioned earlier, the memory die 20 may be one of the plurality of die 11 in FIG. 1 and the pads of the plurality of die 11 and the vias of the plurality of die 11 may be vertically aligned with one another. The vias of the plurality of die 11 may be coupled to one another. Thus, various signals such command signals, address signals, data signals for receiving and transmitting from and/or to an external apparatus may be shared across the plurality of dies through the vias. In other embodiments, the vias may be replaced by wire bonds. In some embodiments, the die and/or wire bonds may not be vertically aligned (e.g., the wire need not be straight).

In some embodiments, the memory die 20 may include a layer identifier (ID) circuit 44. The layer ID circuit 44 may set layer ID information unique to each memory die 20 in a start-up (e.g., initializing) sequence. The memory die 20 may further include a set of layer ID terminals 50 that may receive layer ID information to designate a memory die to be accessed in access operations. While the layer ID information at the terminals 50 is supplied to the input circuit 51, the input circuit 51 may provide the layer ID information to the layer ID circuit 44 of the master die (e.g., Die-0) and may simultaneously provide the layer ID information to the layer ID circuit 44 of each slave die of the slave dies (e.g., Die-1 to Die-7) through the layer via 52. The layer ID circuit 44 may activate the memory die 20 in response to the layer ID information and the command signals received at the command address terminals 31, if the layer ID information is indicative of the memory die 20. In some embodiments, the layer ID information may indicate which die in a stack of die is the master die and which die are slave die. However, in some embodiments, the master/slave assignments and/or layer ID information may be hardcoded (e.g., wired, fuse blowing) in the memory die 20, for example, within the layer ID circuit 44. The layer ID circuit 44 may also activate the internal control signal generator 35 and/or other circuits in some embodiments.

Figure 3:
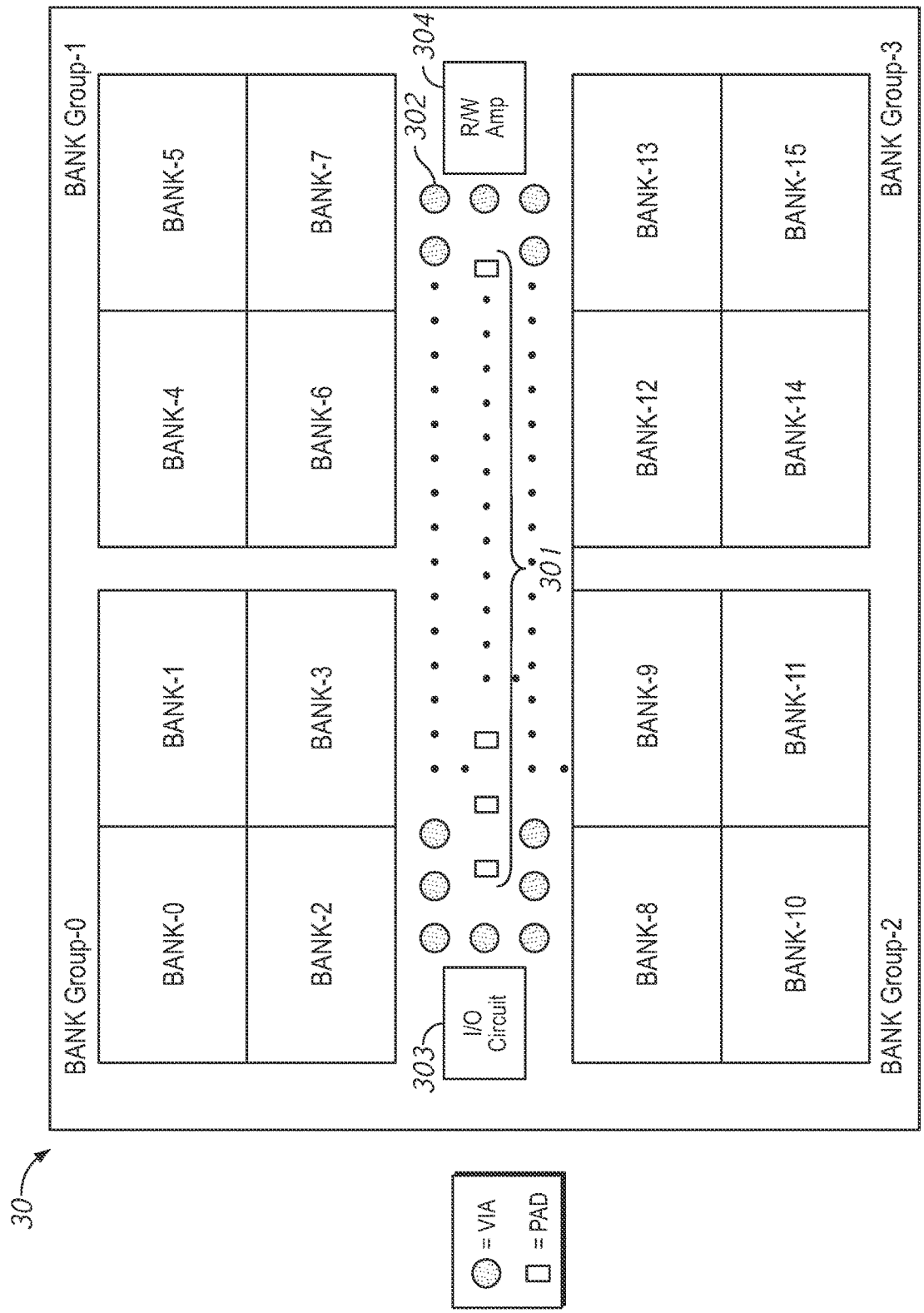
FIG. 3 is a layout diagram of a memory die in accordance with an embodiment of the present disclosure.

FIG. 3 is a layout diagram of a memory die 30 in accordance with an embodiment of the present disclosure. In some embodiments, memory die 30 may be included in memory die 20 of FIG. 2 and/or one or more memory die 11 of FIG. 1. The memory die 30 may include one or more memory banks divided into groups. For example, the number of memory banks may be sixteen (e.g., BANK-0 to BANK-15) and the memory banks may be divided into four bank groups (e.g., BANK Group-0 to BANK Group-3). Thus, each bank group may include one or more banks (e.g., four banks).

The memory die 30 may also include peripheral areas including a central area and edge areas. The peripheral areas may include various elements shown in FIG. 2. For example, one or more pads (PADs) 301 may be included in a central peripheral area of the memory die 30. One or more vias (e.g., TSVs) 302 may also be included in the central peripheral area and disposed around or in the vicinity of the pads 301. In some embodiments, some or all of the vias 302 may be replaced by wire bonds. The vias 302 may be used for communication between different die of a stack such as between master die 12 and slave die 13 of FIG. 1. For example, the vias 302 may be used to transmit commands and/or data between die. Various circuits may be disposed in the peripheral area of the memory die 30. For example, input/output circuits 303 and read/write amplifiers 304 may be disposed in the central peripheral area. The input/output circuit 304 and the read/write amplifiers 304 may operate as previously described with reference to FIG. 2. The arrangement of components in FIG. 3 is provided only as an example and the layout of the banks and peripheral areas of memory die 30 may be different in other embodiments. Although only the pads 301 and vias 302, and input/output circuits 303 and read/write amplifiers 304 are shown, as noted previously, the peripheral areas may include some or all of the elements shown in FIG. 2. This may leave limited space for vias and/or wire bonds.

Figure 4:
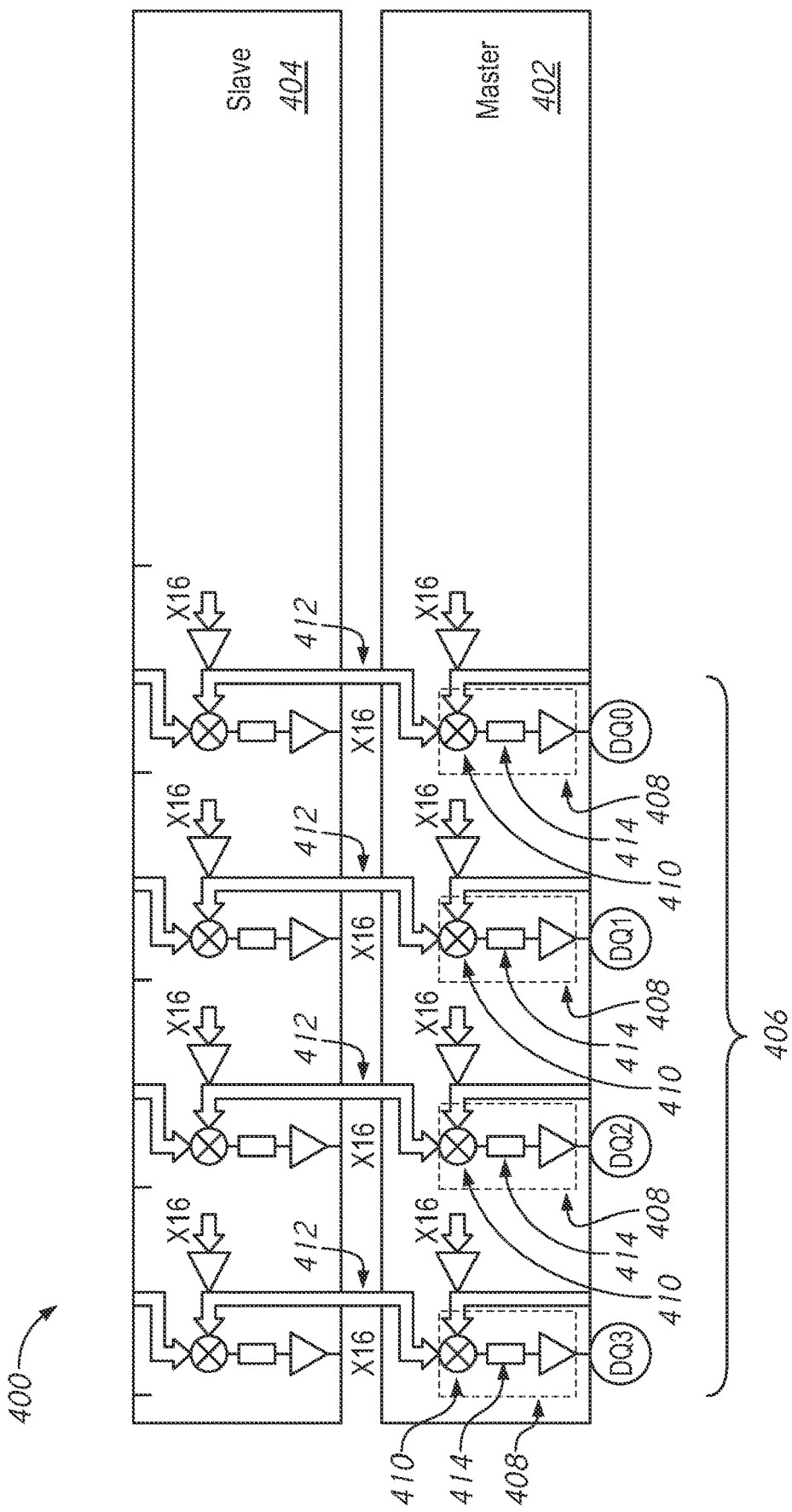
FIG. 4 is a schematic diagram of a memory device.

FIG. 4 is a schematic diagram of a memory device 400. The memory device 400 includes a master die 402 and a slave die 404. In the example shown in FIG. 4, the memory device 400 is a ×4 device with a burst length of 16 bits (16 BL). That is, the IO width is four bits (e.g., number of DQ pads 406 is four) and each of the DQ pads 406 outputs 16 bits of data in series during a burst (e.g., of a read operation). The master die 402 and slave die 404 may be coupled together (e.g., wired) such that the data provided to the DQ pads 406 come from the master die 402 or the slave die 404. As discussed with reference to FIG. 2, data output circuits 408 of the master die 402 may receive data from the master die 402 and/or slave die 404 and data selection circuits 410 of the data output circuits 408 may be used to provide to the DQ pads 406. In some embodiments, the data selection circuit 410 may include a multiplexer and/or one or more OR logic gates to select between data from the master die 402 and slave die 404.

Although only four connectors 412 are shown between the master die 402 and slave die 404, in actuality, there are many more connectors (e.g., wire bonds, vias) between the master die 402 and slave die 404 to transmit data. Continuing the above example, for a ×4 IO width and a 16 BL, 64 bits of data must be transmitted to the DQ pads 406. Typically, all 64 bits are provided to the data output circuits 408 in parallel, which then serializes the bits with a serializer circuit 414 for output to the DQ pads 406. In some embodiments, the serializer circuit 414 may include a first-in-first-out (FIFO) circuit. Providing all of the bits in parallel from the slave die 404 to the master die 402 requires 64 vias and/or wire bonds.

If a burst length of 32 bits (32 BL) rather than 16 bit (16 BL) was desired from memory device 400, 128 connectors would be required. In some applications, the memory die may not be capable of supporting 128 connectors. Thus, a memory device that can support longer burst lengths without increasing (or without significantly increasing) the number of connectors between master and slave die is desired.

In some embodiments of the disclosure, a memory device may include multiple die, one of which may be a master die. The master die may include multiple output terminals (e.g., DQ pads). The memory device may retrieve data (e.g., responsive to a read command) from the multiple die, and data from the die may be provided to the master die. The master die may serialize data from each of the multiple die and provide the data to the output terminals. Serialized data from one die may be provided for one portion of a data burst and serialized data from another die may be provided for another portion of the data burst. By using the multiple die to provide data for different portions of the data bust, in some embodiments, the burst length of the memory device may be increased. In some embodiments, the burst length may be increased without increasing a number of connectors between the die or decreasing a number of additional connectors required.

Figure 5:
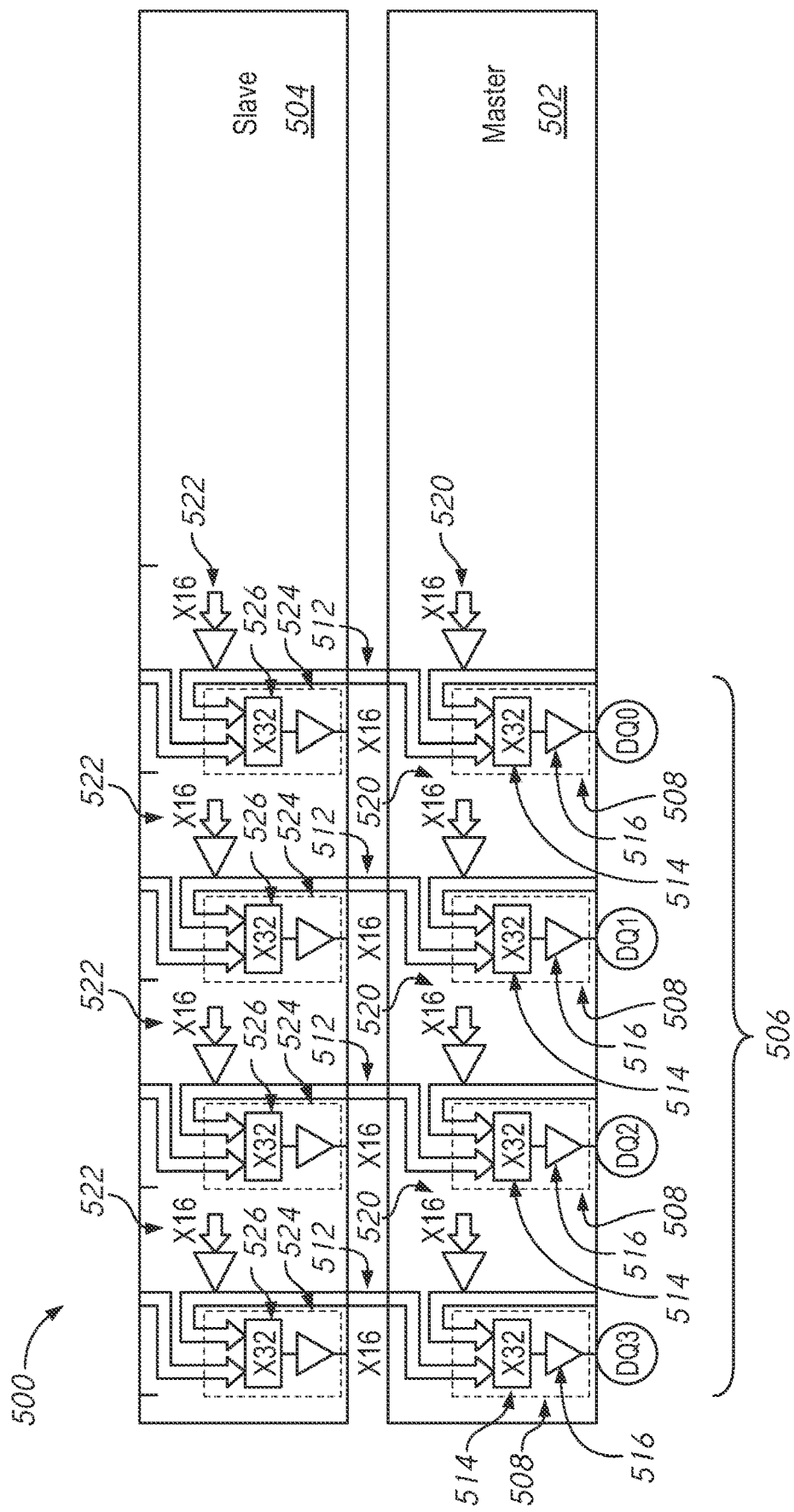
FIG. 5 is a schematic diagram of a memory device in accordance with an embodiment of the present disclosure.

FIG. 5 is a schematic diagram of a memory device 500 in accordance with an embodiment of the present disclosure. In some embodiments, memory device 500 may be included in memory device 10 of FIG. 1. In some embodiments, memory device 500 may include memory die 20 of FIG. 2 and/or memory die 30 of FIG. 3. In some embodiments, memory device 500 may be a ×4 device with a burst length of 32 bits (32 BL).

Memory device 500 may include a master die 502 and a slave die 504. Master die 502 and slave die 504 may have similar or identical circuit layouts in some embodiments. For example, master die 502 and slave die 504 may both include all of the components shown in memory die 20 shown in FIG. 2. In some embodiments, one or more components on the slave die 504 may be disabled and/or unused. For example, the command decoder may be disabled and/or unused on the slave die 504. Master die 502 and slave die 504 may be coupled by one or more connectors 512. In some embodiments, the connectors 512 may include TSVs and/or wire bonds. Other suitable connectors may be used in other embodiments. As will be described, at least some of the connectors 512 may be used to transmit and/or receive data between the master die 502 and slave die 504.

The master die 502 may include multiple output terminals 506. In the example shown in FIG. 5, the master die includes four output terminals 506 DQ0-3. One or more of the output terminals from output terminals 506 may be coupled to a component external to memory device 500 (e.g., a substrate, a memory controller). The output terminals 506 may receive data from an data output circuits 508 of the master die 502. The data output circuits 508 may be included in an IO circuit, such as IO circuit 25, in some embodiments. The data output circuits 508 may include a serializer circuit 514 and an output buffer 516 in some embodiments. In some embodiments, such as the one shown in FIG. 5, the data output circuits 508 may include a serializer circuit 514 and an output buffer 516 for each of the output terminals 506.

The data output circuits 508 may receive data from a memory cell array (not shown in FIG. 5), such as memory cell array 21, of the master die 502 via data path 520. Data path 520 may include a conductive line between a read/write amplifier (not shown in FIG. 5), such as read/write amplifier 24, and the IO circuit 25 in some embodiments. The data output circuits 508 may receive data from a memory cell array (not shown in FIG. 5) of slave die 504 via connectors 512. In some embodiments, such as the one shown in FIG. 5, the data may be provided to the connectors 512 via data path 522. In some embodiments, the data path 522 may include a conductive line between a read/write amplifier (not shown in FIG. 5) of the slave die 504. The data output circuit 508 receives data from the master die 502 and the slave die 504 and provides the data from both die during a burst of data.

Data may be provided from the memory arrays of the master die 502 and slave die 504 as parallel data. For example, data paths 520 and 522 may include conductive lines for each bit of data to be transmitted. Furthermore, to transmit data from the slave die 504 to the master die 502, the number of connectors 512 may equal the number of conductive lines in data path 522. The parallel data may be provided to the serializer circuit 514. In some embodiments, the serializer circuit 514 may include one or more FIFO circuits. The serializer circuit 514 may receive the parallel data and serialize the data prior to providing the data to the output terminals 506. In some embodiments, the serializer circuit 514 may serialize the data from the master die 502 or the slave die 504 prior to serializing the data from the other die (e.g., the data may be serialized at different times in series). In some embodiments, the serializer circuit 514 may serialize data from the master die 502 and the slave die 504 concurrently (e.g., the data may be serialized at the same time or nearly the same time). In some embodiments, the serialized data may be provided to an output buffer 516 prior to being provided to the output terminals 506.

The slave die 502 may also include data output circuits 524. In some embodiments, the output circuits 524 may include similar or identical components to the data output circuits 508. For example, the output circuits 524 may include serializer circuit 526, which may be similar or identical to the serializer circuit 514. However, the data output circuits 524 may be disconnected and/or disabled. For example, a layer ID circuit, such as layer ID circuit 44, of the slave die 502 may disable the data output circuits 524. In some examples, the data output circuits 524 may be disabled when data from the data paths 522 are provided to the data output circuits 508 of the master die 502. In some embodiments, the data output circuits 524 may be disconnected and/or disabled by hard wiring and/or fuse blowing.

In some embodiments, data for 16 bits per output terminal 506 (e.g., 64 bits) may be retrieved from the master die 502 and the slave die 504. In some embodiments, the serializer circuit 514 may serialize data from the master die 502 to provide data for one portion of a data burst and serialize data from the slave die 504 to provide data for another portion of a data burst. Thus, each die may provide a portion of the data for a data burst. In the example shown in FIG. 5, the master die 502 and the slave die 504 each provide 16 bits of data such that the memory device 500 outputs data for a burst length of 32.

In addition to providing parallel data from the memory arrays, in some embodiments, the data from the master die 502 and slave die 504 may be accessed/retrieved concurrently. That is, the data may be retrieved from both die and provided to the data output circuit 508 simultaneously and/or near simultaneously in some embodiments. In other embodiments data may be provided from the master die 502 or the slave die 504 first and data from the other die may be provided later. In these embodiments, data may be retrieved from one die while data from the other die is being serialized and/or provided as an initial portion of a data burst. Thus, in some embodiments, the data transmission rate between the slave die 504 and the master die 502 may be slower than the transmission rate of data between the master die 502 and the output terminals 506. This may reduce power consumption and/or reduce stress on the connectors 512 in some embodiments.

In contrast to the embodiment shown in FIG. 4, instead of providing data for the entire data burst from either the master die 502 or the slave die 504 as in memory device 400, in some embodiments, memory device 500 may provide a portion of the data from the master die 502 and another portion of the data from the slave die 504 for a data burst. Providing different portions of the data from different die of the memory device 500 for a data burst may reduce a number of connectors 512 required to support, for example a 32 BL, in some embodiments. For example, to support a 32 BL, memory device 500 may only require 64 connectors 512 instead of 128 as memory device 400 would require.

In some embodiments, the number of connectors 512 may be further reduced by using double pumping. In double pumping, two bits are provided serially to the data output circuits 508. Thus, the number of connectors 512 may be reduced from 64 to 32. However, double pumping could require transferring data at twice the speed and/or utilize more power.

Embodiments of the disclosure are not limited to a particular number of die (e.g., two die as shown in FIG. 5) or a particular burst length (e.g., 32 BL as shown in FIG. 5). Rather, apparatuses and methods disclosed herein may be applied to any number of die and burst length. Furthermore, in some embodiments, different die may provide different proportions of the data burst (e.g., the master die may provide 24 bits and the slave die may provide 8 bits).

Figure 6:
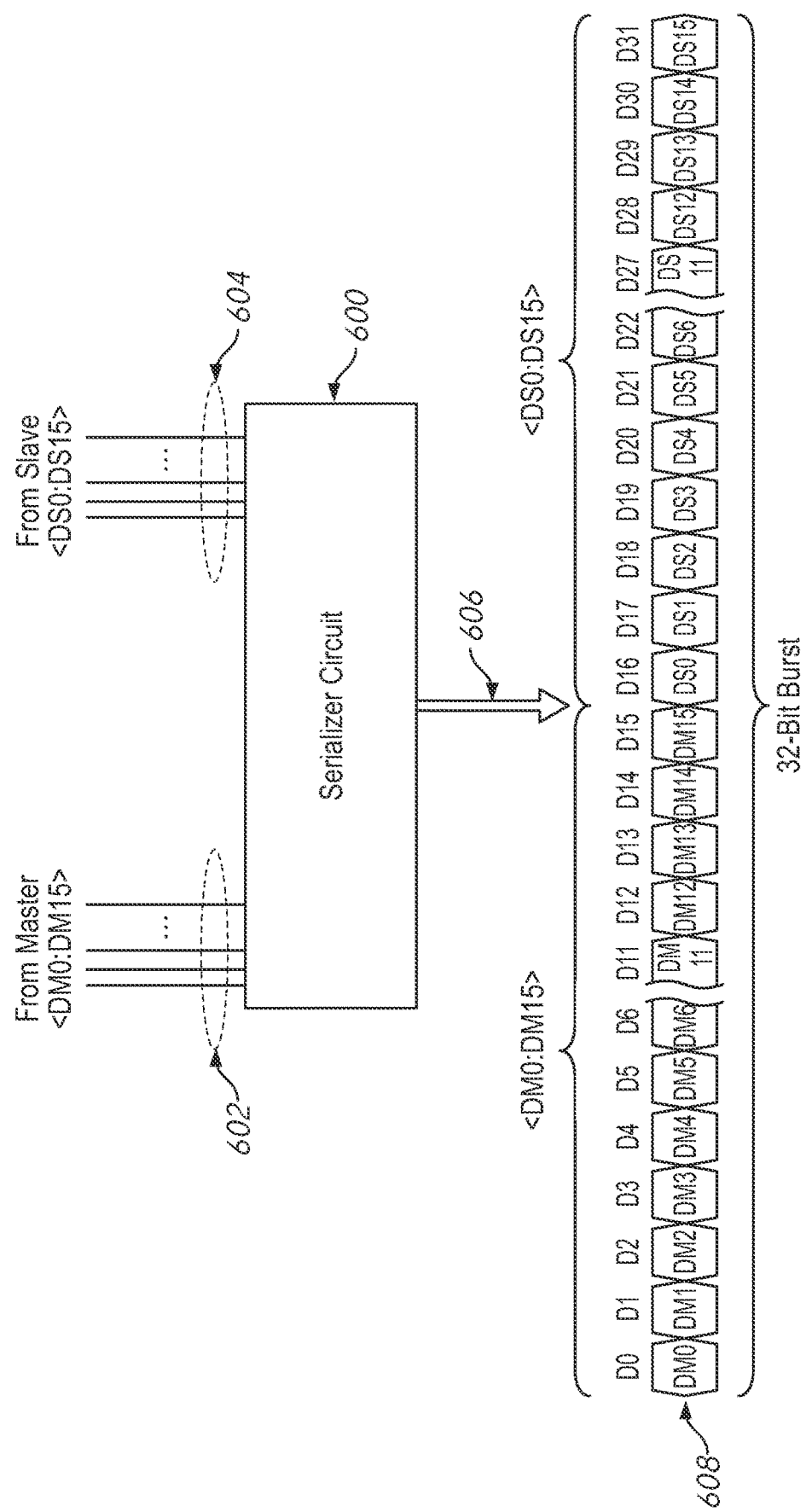
FIG. 6 is a block diagram of a serializer circuit 600 in accordance with an embodiment of the present disclosure

FIG. 6 is a block diagram of a serializer circuit 600 in accordance with an embodiment of the present disclosure. In some embodiments, the serializer circuit 600 may be included in serializer circuit 514. In some embodiments, serializer circuit 600 may be included in IO circuit 25. The serializer circuit 600 may receive bits <DM0:DM15> from a master die, such as master die 502 or master die 12. The bits <DM0:DM15> may be received as parallel data from data path 602. In some embodiments, data path 602 may be included in data path 520. The serializer circuit 600 may receive bits <DS0;DS15> from a slave die, such as slave die 504 or slave die 13. The bits <DS0:DS15> may be received as parallel data from data path 604. In some embodiments, data path 604 may be included in data path 522 and/or connectors 512. In some embodiments, bits <DM0:DM15> and bits <DS0:DS15> may be received concurrently. In some embodiments, bits <DM0:DM15> and bits <DS0:DS15> may be received at different times. For example, in some embodiments, bits <DM0:DM15> may be received prior to bits <DS0:DS15>.

The serializer circuit 600 may serialize bits <DM0:DM15> and bits <DS0:DS15> to provide bits <D0:D31> of a 32-bit burst of data 608. The burst of data 608 may be provided through data path 606 to an output terminal (not shown), such as output terminals 506 or output terminals 37. In the example shown in FIG. 6, bits <D0:D15> of the burst of data 608 include bits <DM0:DM15> from the master die and bits <D16:D31> of the burst of data 608 include bits <DS0:DS15> from the slave die. However, the arrangement of bits from the master and slave die in the burst of data 608 may be different in other examples (e.g., bits <D0:D15> of the burst of data 608 include bits <DS0:DS15> from the slave die and bits <D16:D31> of the burst of data 608 include bits <DM0:DM15> from the master die; the data <DM0:DM15> from the master die and the data <DS0:DS15> from the slave die may be interleaved, etc.). Alternatively or additionally, in other examples, other portions of the burst of data 608 may have come from other die. For example, bits <D0:D15> of the burst of data 608 may include bits <DS0:DS15> from the slave die and bits <D16:D31> of the burst of data 608 may include bits <DM0:DM15> from the master die.

Figure 7:
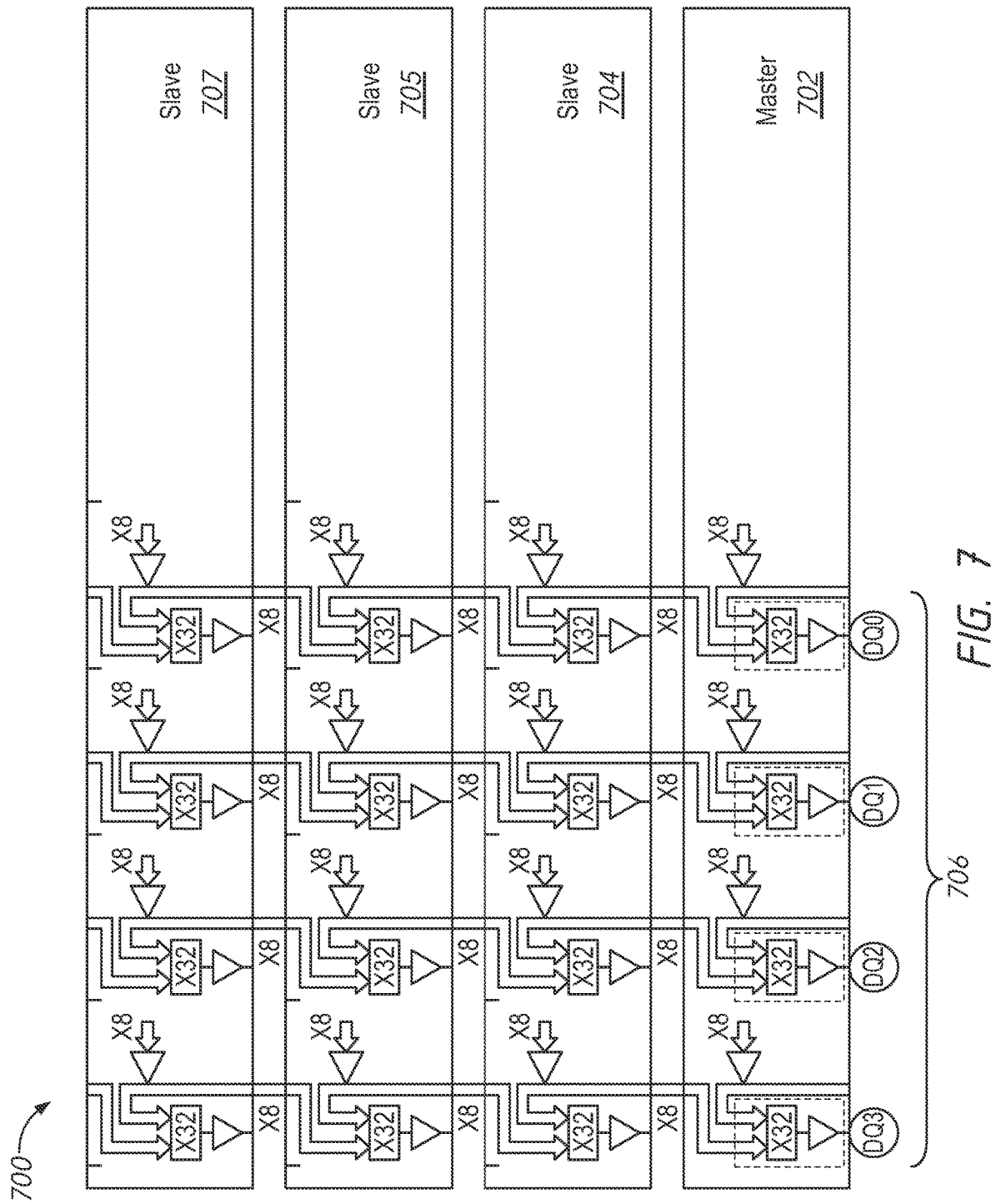
FIG. 7 is a schematic diagram of a memory device in accordance with an embodiment of the present disclosure.

FIG. 7 is a schematic diagram of a memory device 700 in accordance with an embodiment of the present disclosure. In some embodiments, memory device 700 may be included in memory device 10 of FIG. 1. In some embodiments, memory device 700 may include memory die 20 of FIG. 2 and/or memory die 30 of FIG. 3. In some embodiments, memory device 700 may be a ×4 device. Memory device 700 may include master die 702 and slave die 704, 705, and 707. The master die 702 and slave die 704, 705, and 707 may include one or more components substantially the same as master die 502 and slave die 504, respectively, for example, data output circuits, data paths, and connectors. For brevity, an explanation of these components will not be repeated here.

In some embodiments, a 32 BL may be supported by memory device 700 by providing a portion of the data from each die 702, 704, 705, and 707 for different portions of the data burst. In some embodiments, each die 702, 704, 705, and 707 may provide 8 bits of data for the 32 bit data burst. For example, bits <31:0> of the 32-bit burst may include: bits <7:0> from the master die 702, bits <15:8> from die 704; bits <23:16> from die 705; and bits <31:24> from die 707. Data for the data burst from all of the die are provided from the master die 702 to output terminals 706.

Similar to memory device 500, data may be provided from the memory arrays of the master die 702 and slave die 704, 705, and 707 as parallel data which may then be serialized on the master die 702. In some embodiments, the data from the master die 702 and slave die 704, 705, and 707 may be accessed/retrieved concurrently. That is, the data may be retrieved from all die and provided the data output circuits of the mater die 702 simultaneously or near simultaneously. However, in other embodiments, retrieving and/or providing the data from the die may be staggered in time (e.g., data from slave die 704 is provided prior to the data from slave die 705). In some embodiments, memory device 700 may require fewer connectors between the die 702, 704, 705, and 707 to support a 32 BL than a memory device that acquires all of the data from a single die.

Figure 8:
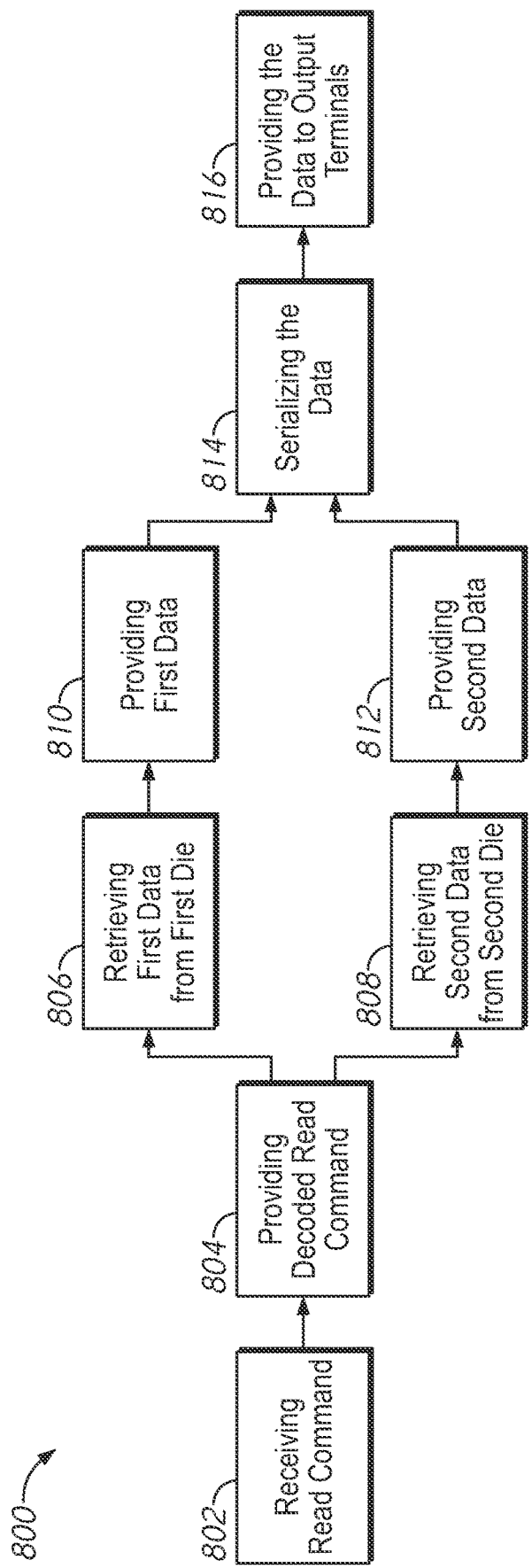
FIG. 8 is a flow chart of a method in accordance with an embodiment of the present disclosure.

FIG. 8 is a flow chart of a method 800 in accordance with an embodiment of the present disclosure. In some embodiments, some or all of the method 800 may be performed by memory device 10, memory die 20, memory die 30, memory device 500, and/or memory device 700.

At block 802, "receiving a read command" may be performed. In some embodiments, the read command may be received at a command decoder, such as command decoder 34. At block 804, "providing a decoded read command" may be performed. The decoded read command may be provided by the command decoder in some embodiments. In some embodiments, the decoded read command may be provided to a first die and a second die. In some embodiments, the first die may be a master die, such as master die 12, 502, and/or 702. In some embodiments, the second die may be a slave die, such as slave die 13, 504, 704, 705, and/or 707. In some embodiments, the command decoder is located on the first die.

At block 806, "retrieving first data" may be performed. In some embodiments, the retrieving is performed responsive to the decoded read command. In some embodiments, the first data may be retrieved from a memory cell array, such as memory cell array 21, of the first die. At block 808, "retrieving second data" may be performed. In some embodiments, the retrieving is performed responsive to the decoded read command. In some embodiments, the second data may be retrieved from a memory cell array, such as memory cell array 21, of the second die. In some embodiments, blocks 806 and 808 may be performed concurrently (e.g., at the same time, simultaneously or near simultaneously). In some embodiments, block 806 may be performed before block 808. In some embodiments, block 808 may be performed before block 806. That is, blocks 806 and 808 may be performed in series.

At block 810, "providing first data" may be performed. In some embodiments, the first data is provided to an IO circuit, such as IO circuit 25 and/or a data output circuit such as data output circuit 508. At block 812, "providing second data" may be performed. In some embodiments, the second data is provided to an IO circuit, such as IO circuit 25 and/or a data output circuit such as data output circuit 508. In some embodiments, blocks 810 and 812 may be performed concurrently (e.g., at the same time, simultaneously or near simultaneously). In some embodiments, block 810 may be performed before block 812. In some embodiments, block 812 may be performed before block 810. That is, blocks 810 and 812 may be performed in series.

At block 814, "serializing the data" may be performed. Serializing the data may include serializing the first data and serializing the second data in some embodiments. In some embodiments, the serializing may be performed by a serializer circuit, such as serializer circuit 514 and/or serializer circuit 600. In some embodiments, serializing the first data and serializing the second data may be performed concurrently. In other embodiments, serializing the first data and serializing the second data are performed in series.

At block 816, "providing the data to output terminals" may be performed. In some embodiments, the output terminals may be output terminals 37, 505, and/or 706. In some embodiments, the first data may be provided to the output terminals as a portion of a data burst. In some embodiments, the second data may be provided to the output terminals as another portion of the data burst. For example, the first data may be bits <15:0> and the second data may be bits <31:16> of a 32 BL data burst. In another example, the second data may be bits <15:0> and the first data may be bits <31:16>.

Figure 9:
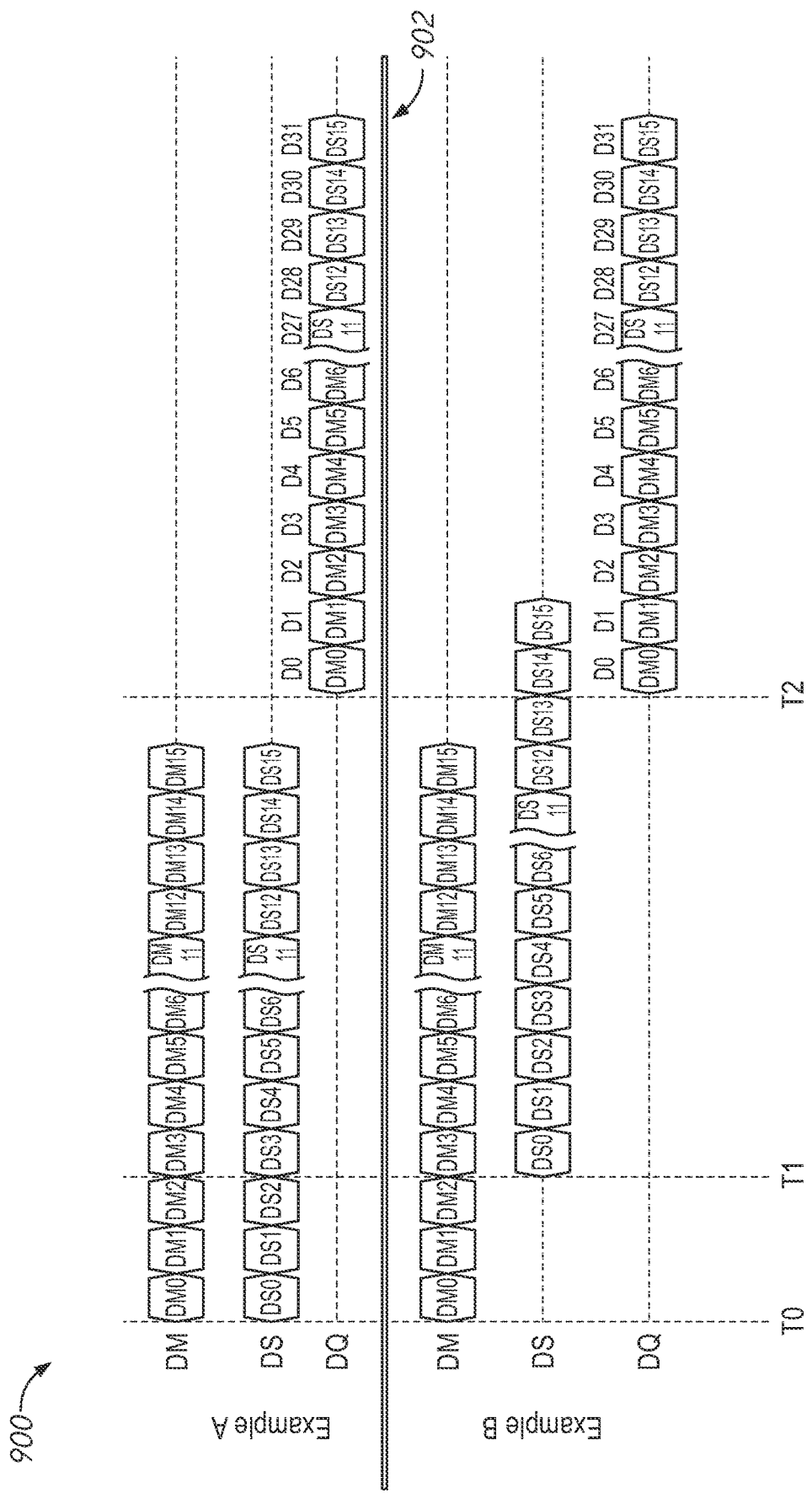
FIG. 9 is a timing diagram in accordance with embodiments of the present disclosure.

FIG. 9 is a timing diagram 900 in accordance with embodiments of the present disclosure. The timing diagram 900 shows the timing of serializing data from a first die DM, such as a master die, the timing of serializing data from a second die DS, such as a slave die, and the timing of providing the serialized data as a burst of data (e.g., a data burst) DQ. In some embodiments, the serializing may be performed by a serializer circuit, such as serializer circuit 514 and/or serializer circuit 600. However, the timing of the serializing operations shown in timing diagram 900 are not limited to the serializer circuits 514 and 600. Furthermore, the timings of serializing operations shown in FIG. 9 are merely examples and the timing of serializing operations and the operation of serializer circuits 514 and 600 are not limited to the example timings provided.

In a first example, Example A, illustrated above line 902, data from both the first die and the second die are serialized beginning at or around time T0. In the example shown, 16 bits of data are provided from each die. After the data from the first die and the second die have been serialized, beginning at or around time T2, the serialized data from the first die and the second die are provided as a data burst. In the example shown in FIG. 9, a delay of one unit interval (UI) is provided between the completion of serializing the data and providing the data burst. However, in other examples, there may be a different delay (e.g., zero, 2, 4 UIs). A unit interval may correspond to the duration of one bit of data. In the example shown, the burst length is 32-bits where the first 16 bits include data from the first die and the second 16 bits include data from the second die. However, the data burst may include other arrangements of the data from the first die and the second die in other examples (e.g., the first portion of the data burst may include data from the second die). In some embodiments, Example A may provide a timing of operations for when data is received from the first die and the second die concurrently. In other embodiments, data from one die may be provided prior to data being provided from the other die and the serializer circuit may wait until all data is received before serializing the data concurrently. However, in these embodiments, a delay between a read operation and providing the data for the data burst may be greater.

In a second example, Example B, illustrated below line 902, data from the first die is serialized beginning at or around time T0. Data from the second die is serialized beginning at or around time T1. In the example shown, 16 bits of data are provided from each die. In the example shown, the delay between time T1 and time T2 is three UIs. However, in other examples, there may be a different delay between time T1 and time T2 (e.g., 2, 4, 8 UIs). In some embodiments of the disclosure, after the data from the first die has been serialized, but prior to the completion of serializing data from the second die, beginning at or around time T2, the serialized data from the first die is provided followed by the serialized data from the second die as a data burst. In the example shown in FIG. 9, a delay of one UI is provided between the completion of serializing the data from the first die and providing the data burst. However, in other examples, there may be a different delay (e.g., zero, 2, 4 UIs). In the example shown, the burst length is 32-bits where the first 16 bits include data from the first die and the second 16 bits include data from the second die. In some embodiments, Example B may provide a timing of operations for when data is received from the first die and the second die at different times. In some embodiments, this may permit communications between the first die and the second die to occur at a slower rate.

Although the above descriptions have been in reference to access operations where data is provided from a memory device (e.g., read operations), embodiments of the present disclosure may apply to access operations where data is provided to a memory device (e.g., write operations). For example, a burst of data may be provided to the memory device from a memory controller. The data may be received at a master die of the memory device. A portion of the burst of data may be stored on the master die and another portion of the burst of data may be stored on a slave die of the memory device. For example, if a data burst is 32-bits, the first 16 bits may be stored on the master die and the second 16 bits may be stored on the slave die.

Figure 10:
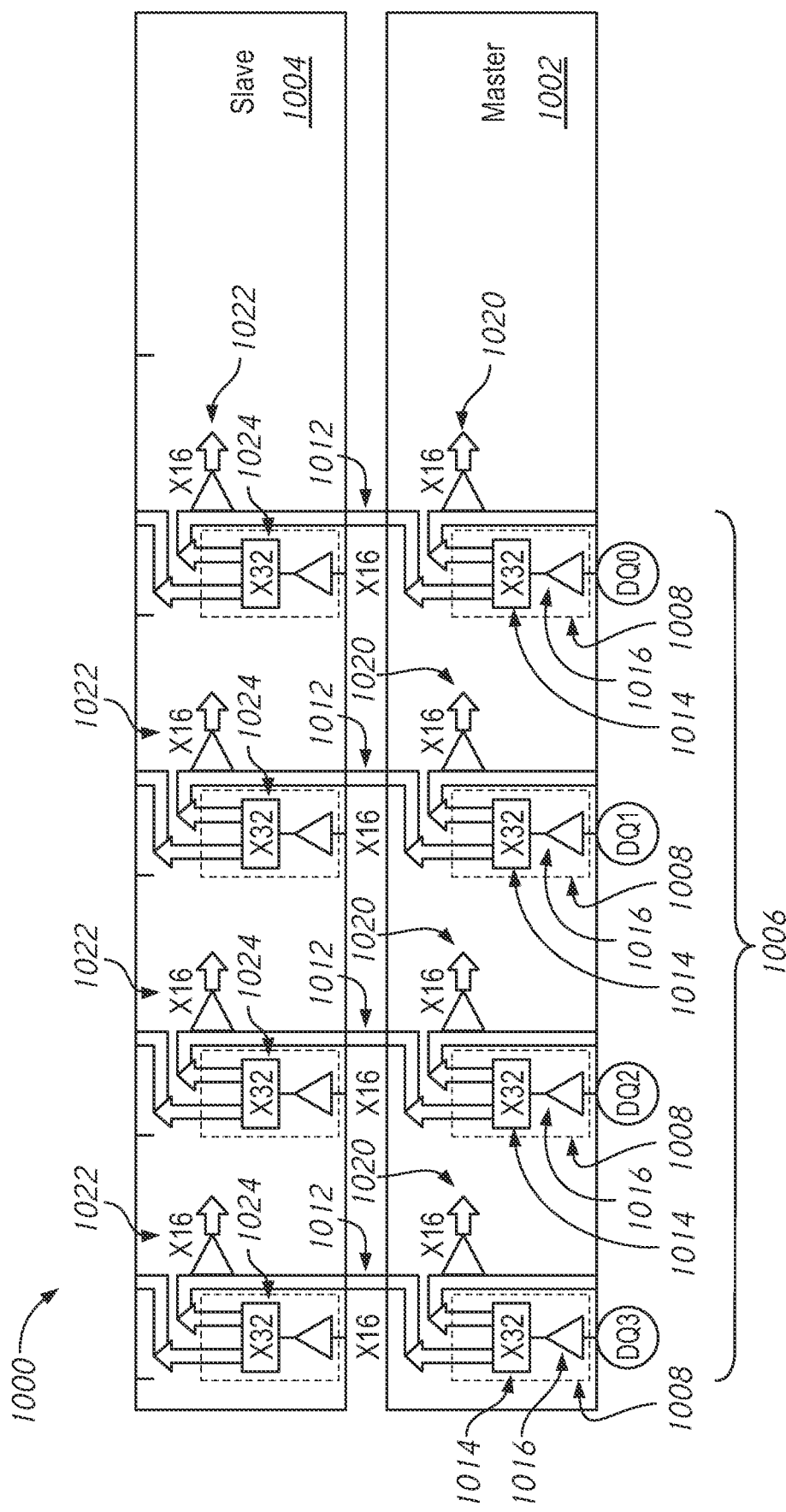
FIG. 10 is a schematic diagram of a memory device in accordance with an embodiment of the present disclosure.

FIG. 10 is a schematic diagram of a memory device 1000 in accordance with an embodiment of the present disclosure.

In some embodiments, memory device 1000 may be included in memory device 10 of FIG. 1 and/or memory device 500 in FIG. 5. In some embodiments, memory device 1000 may include memory die 20 of FIG. 2 and/or memory die 30 of FIG. 3. In some embodiments, memory device 1000 may be a ×4 device with a burst length of 32 bits (32 BL).

Memory device 1000 may include a master die 1002 and a slave die 1004. Master die 1002 and slave die 1004 may have similar or identical circuit layouts in some embodiments. For example, master die 1002 and slave die 1004 may both include all of the components shown in memory die 20 shown in FIG. 2. In some embodiments, one or more components on the slave die 1004 may be disabled and/or unused. For example, the command decoder may be disabled and/or unused on the slave die 1004. Master die 1002 and slave die 1004 may be coupled by one or more connectors 1012. In some embodiments, the connectors 1012 may include TSVs and/or wire bonds. Other suitable connectors may be used in other embodiments. As will be described, at least some of the connectors 1012 may be used to transmit and/or receive data between the master die 1002 and slave die 1004.

The master die 1002 may include multiple input terminals 1006. In some embodiments, the input terminals 1006 may also be used as output terminals during other operations, such as output terminals 506. In the example shown in FIG. 10, the master die 1002 includes four input terminals 1006 DQ0-3. One or more of the input terminals from input terminals 1006 may be coupled to a component external to memory device 1000 (e.g., a substrate, a memory controller). The input terminals 1006 may provide data to data input circuits 1008 of the master die 1002. The data input circuits 1008 may be included in an IO circuit, such as IO circuit 25, in some embodiments. The data input circuits 1008 may include a deserializer circuit 1014 and an input buffer 1016 in some embodiments. In some embodiments, such as the one shown in FIG. 10, the data input circuits 1008 may include a deserializer circuit 1014 and an input buffer 1016 for each of the input terminals 1006.

The data input circuits 1008 may provide data to a memory cell array (not shown in FIG. 10), such as memory cell array 21, of the master die 1002 via data path 1020. Data path 1020 may include a conductive line between a read/write amplifier (not shown in FIG. 10), such as read/write amplifier 24, and the IO circuit 25 in some embodiments. The data input circuits 1008 may provide data to a memory cell array (not shown in FIG. 10) of slave die 1004 via connectors 1012. In some embodiments, such as the one shown in FIG. 10, the data may be provided from the connectors 1012 to data path 1022. In some embodiments, the data path 1022 may include a conductive line between a read/write amplifier (not shown in FIG. 10) of the slave die 1004 and the connectors 1012. The data input circuit 1008 receives data during a burst of data and provides the data to the master die 1002 and the slave die 1004.

Data may be provided to the memory arrays of the master die 502 and slave die 504 as parallel data. For example, data paths 520 and 522 may include conductive lines for each bit of data to be transmitted. Furthermore, to transmit data to the slave die 1004 from the master die 1002, the number of connectors 1012 may equal the number of conductive lines in data path 1022. The parallel data may be provided from the deserializer circuit 1014. The deserializer circuit 1014 may receive serial data from the input terminal 1006 and deserialize the data prior to providing the data to the master die 1002 and slave die 1004. In some embodiments, the deserializer circuit 1014 may deserialize the data for the master die 1002 or the slave die 1004 and begin providing the parallel data to one of the die prior to providing the parallel data to the other. In some embodiments, the deserializer circuit 1014 may deserialize data from the master die 1002 and the slave die 1004 and provide the parallel data to both die concurrently (e.g., the data may be provided at the same time or nearly the same time). In some embodiments, the serialized data may be provided to an input buffer 1016 prior to being provided to the deserializer circuit 1014.

The slave die 1002 may also include data input circuits 1024. In some embodiments, the input circuits 1024 may include similar or identical components to the data input circuits 1008. For example, the input circuits 1024 may include deserializer circuit 1026, which may be similar or identical to the deserializer circuit 1014. However, the data input circuits 1024 may be disconnected and/or disabled. For example, a layer ID circuit, such as layer ID circuit 44, of the slave die 1002 may disable the data input circuits 1024. In some embodiments, the data input circuits 1024 may be disconnected and/or disabled by hard wiring and/or fuse blowing.

In some embodiments, data for 16 bits per input terminal 1006 (e.g., 64 bits) may be provided to the master die 1002 and the slave die 1004. In some embodiments, the deserializer circuit 1014 may deserialize data received in a burst of data to provide a portion of the data for a portion of the burst to the master die 1002 and provide another portion of the data for another portion of the data burst to slave die 1004. Thus, each die may receive a portion of the data from a data burst. In the example shown in FIG. 10, the master die 1002 and the slave die 1004 each receive 16 bits of data such that the memory device 1000 receives data for a burst length of 32. For example, bits <D0:15> may be provided to the master die 1002 and bits <D16:31> may be provided to the slave die 1004.

The apparatuses and methods disclosed herein may allow for 3D memory/stacked memory, such as master slave memory (MSM) to provide and/or receive longer burst lengths without increasing a number of connectors between the die of the stack in some embodiments. For example, a memory device may include multiple die, one of which may be a master die. The master die may include multiple input/output terminals. For some memory access operations, such as read operations, the memory device may retrieve data from the multiple die. Data from the die may be provided to the master die. The master die may provide data from one or more of the multiple die for different portions of a data burst. For some memory access operations, such as write operations, the memory device may provide data to the multiple die. Data may be provided to the master die. The master die may provide the data to one or more of the multiple die for different portions of a data burst.

The description of certain embodiments herein is merely exemplary in nature and is in no way intended to limit the scope of the disclosure or its applications or uses. In the detailed description of the present apparatuses, systems and methods, reference is made to the accompanying drawings which form a part hereof, and which are shown by way of illustration specific embodiments in which the described apparatuses, systems and methods may be practiced. These embodiments are described in sufficient detail to enable those skilled in the art to practice presently disclosed apparatuses and methods, and it is to be understood that other embodiments may be utilized and that structural and logical changes may be made without departing from the spirit and scope of the disclosure. Moreover, for the purpose of clarity, detailed descriptions of certain features are not discussed when they would be apparent to those with skill in the art so as not to obscure the description of embodiments of the disclosure. The detailed description is therefore not to be taken in a limiting sense, and the scope of the disclosure is defined only by the appended claims.

Of course, it is to be appreciated that any one of the examples, embodiments or processes described herein may be combined with one or more other examples, embodiments and/or processes or be separated and/or performed amongst separate devices or device portions in accordance with the present systems, devices and methods. Finally, the above-discussion is intended to be merely illustrative and should not be construed as limiting the appended claims to any particular embodiment or group of embodiments. Thus, while various embodiments of the disclosure have been described in particular detail, it should also be appreciated that numerous modifications and alternative embodiments may be devised by those having ordinary skill in the art without departing from the broader and intended spirit and scope of the present disclosure as set forth in the claims that follow. Accordingly, the specification and drawings are to be regarded in an illustrative manner and are not intended to limit the scope of the appended claims.

What is claimed is:

1. A memory device comprising:
a first die comprising a plurality of output terminals configured to provide first data for a first portion of a data burst and second data for a second portion of the data burst, wherein the first die is configured to serialize the first data and the second data;
a second die configured to provide the second data, wherein the second data is provided from the second die as parallel data; and
a plurality of connectors coupling the first die and the second die.

2. The memory device of claim 1, wherein the second data is provided as double pump data.

3. The memory device of claim 1, further comprising:
a third die;
a fourth die;
a second plurality of connectors coupling the first die and the third die; and
a third plurality of connectors coupling the first die and the fourth die;
wherein the plurality of output terminals are further configured to provide the third data for a third portion of the data burst and provide the fourth data for a fourth portion of the data burst.

4. The memory device of claim 1, wherein the first die is configured to receive commands from an external component and provide at least some of the commands to the second die.

5. The memory device of claim 4, wherein the second data is provided from the second die responsive to receiving a command from the first die.

6. The memory device of claim 1, wherein the second data is provided from the second die at a slower rate than the second data is provided from the plurality of output terminals.

7. A method comprising:
receiving a read command at a first die;
providing, the read command from the first die to a second die;
responsive to the read command:
serializing first data from the first die at the first die;
serializing second data from the second die at the first die;
providing the serialized first data from the first die to a plurality of output terminals as a portion of a data burst; and
providing the serialized second data from the first die to the plurality of output terminals as another portion of the data burst.

8. The method of claim 7, wherein the first data and the second data are retrieved from the first die and the second die, respectively, concurrently.

9. The method of claim 7, wherein the first data and the second data are retrieved from the first die and the second die, respectively, in series.

10. The method of claim 7, wherein serializing the first data and serializing the second data are performed concurrently.

11. The method of claim 7, wherein at least a portion of the serializing of the second data is performed while at least a portion of the first data is provided from the plurality of output terminals.

12. An apparatus comprising:
a first memory die;
a plurality of connectors adjacent to or within the first memory die, wherein the plurality of connectors are coupled to a second memory die and configured to receive second data from the second memory die; and
an output terminal coupled to the first memory die, wherein the output terminal is configured to output first data for a portion of a data burst from the first memory die and output the second data for another portion of the data burst from the plurality of connectors,
wherein the first memory die comprises a serializer circuit configured to serialize the first data and the second data.

13. The apparatus of claim 12, wherein the portion of the data burst for which the first data is provided is a first portion of the data burst and the other portion of the data burst for which the second data is provided is a second portion of the data burst.

14. The apparatus of claim 12, wherein the portion of the data burst and the other portion of the data burst comprise a same number of bits.

15. The apparatus of claim 12, wherein the serializer circuit comprises a first-in-first-out (FIFO) circuit.

16. The apparatus of claim 12, wherein the first memory die includes an output buffer coupled between the serializer circuit and the output terminal.

17. The apparatus of claim 12, wherein the first memory die is configured to receive command and address signals from a host and to relay the command and address signals to the second memory die.

18. An apparatus comprising:
a first memory die;
a plurality of connectors adjacent to or within the first memory die;
a second memory die coupled to the plurality of connectors; and
an input terminal coupled to the first memory die and configured to receive a burst of data, provide first data from the burst of data to the first memory die, and provide second data from the burst of data to the second memory die via the plurality of connectors,
wherein the first memory die comprises a data input circuit comprising a deserializer circuit configured to deserialize the first and second data of the burst of data.

19. The apparatus of claim 18, wherein the first data is included in a first portion of the burst of data and the second data is included in a second portion of the burst of data.

20. The apparatus of claim 18, wherein the plurality of connectors include wire bonds.

* * * * *